US011112470B1

(12) United States Patent
Hamamura et al.

(10) Patent No.: US 11,112,470 B1
(45) Date of Patent: Sep. 7, 2021

(54) MAGNETIC RESONANCE IMAGING APPARATUS AND METHOD WITH IMPROVED DATA TRANSFER

(71) Applicant: CANON MEDICAL SYSTEMS CORPORATION, Otawara (JP)

(72) Inventors: Yoshinori Hamamura, Vernon Hills, IL (US); Mark Spring, Vernon Hills, IL (US); Ernie Zepeda, Vernon Hills, IL (US)

(73) Assignee: CANON MEDICAL SYSTEMS CORPORATION, Otawara (JP)

( * ) Notice: Subject to any disclaimer, the term of this patent is extended or adjusted under 35 U.S.C. 154(b) by 0 days.

(21) Appl. No.: 16/859,559

(22) Filed: Apr. 27, 2020

(51) Int. Cl.
*H04L 25/00* (2006.01)
*G01R 33/36* (2006.01)
*H03M 7/30* (2006.01)
*H04B 3/50* (2006.01)

(52) U.S. Cl.
CPC .............. *G01R 33/36* (2013.01); *H03M 7/60* (2013.01); *H04B 3/50* (2013.01)

(58) Field of Classification Search
CPC .............. H04L 25/0272; H04L 25/0292; H04L 25/028; H03B 3/50; H03M 7/60; A61B 5/055; A61B 2560/0223

USPC .................. 375/257; 324/318, 322
See application file for complete search history.

(56) References Cited

U.S. PATENT DOCUMENTS

| 5,525,906 | A | * | 6/1996 | Crawford | G01R 33/3621 324/318 |
|---|---|---|---|---|---|
| 2010/0329527 | A1 | | 12/2010 | Iannotti et al. | |
| 2012/0286787 | A1 | * | 11/2012 | Van Liere | G01R 33/3621 324/322 |
| 2015/0015256 | A1 | | 1/2015 | Soejima | |
| 2019/0018089 | A1 | | 1/2019 | Ji et al. | |
| 2020/0309881 | A1 | * | 10/2020 | Grodzki | G01R 33/5608 |

* cited by examiner

*Primary Examiner* — Khai Tran
(74) *Attorney, Agent, or Firm* — Oblon, McClelland, Maier & Neustadt, L.L.P.

(57) ABSTRACT

According to one embodiment, a magnetic resonance imaging apparatus includes data acquisition circuitry configured to generate magnetic resonance data; a digital encoder connected to receive the magnetic resonance data and configured to digitally encode the magnetic resonance data using an encoding scheme having a spectral null approximately at the Larmor frequency; and an electric data transmission line connected to transmit the digitally encoded magnetic resonance data.

23 Claims, 11 Drawing Sheets

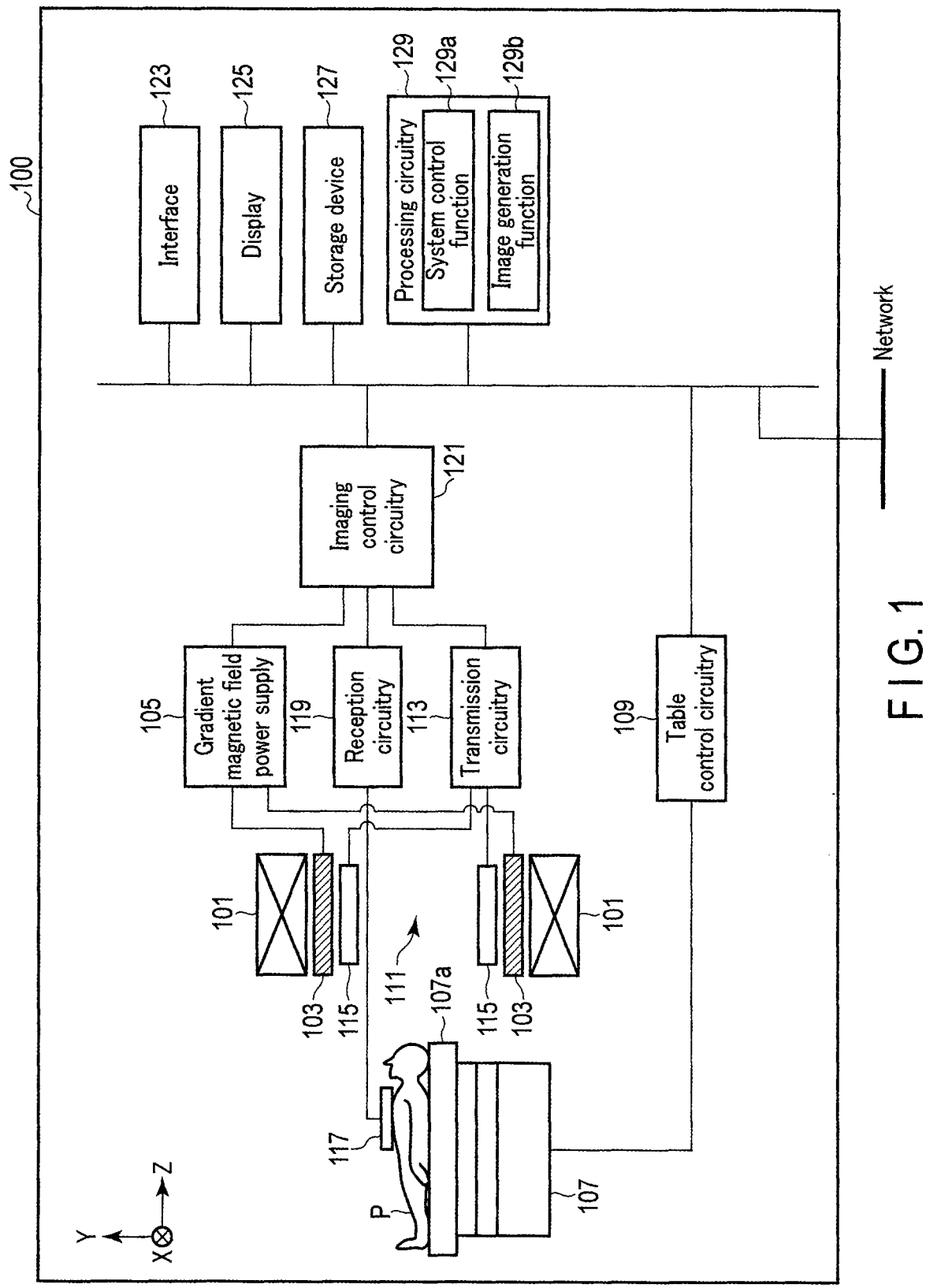
F I G. 1

MAGNETIC RESONANCE IMAGING APPARATUS AND METHOD WITH IMPROVED DATA TRANSFER

FIELD

Embodiments of the present invention relate to a magnetic resonance imaging apparatus and a magnetic resonance imaging method with data transfer using digital data encoding.

BACKGROUND

A magnetic resonance (MR) signal received by an RF coil is transferred to the magnetic resonance imaging (MRI) data acquisition system typically using a coax cable for analog data transfer and using a fiber optical cable for digital data transfer. Analog data transfer requires baluns on the cable which decreases operator usability and increases cost. The fiber optic cables used with digital data transfer also increase cost and the associated opto-electric conversion circuitry can produce excessive heat. The use of coax cables for digital data transfer has not been adopted due to significant data artifacts produced by interference from the RF coil frequencies.

BRIEF DESCRIPTION OF THE DRAWINGS

FIG. 1 is a diagram illustrating the configuration of an MRI apparatus according to the first embodiment.

DETAILED DESCRIPTION

Figure 2:
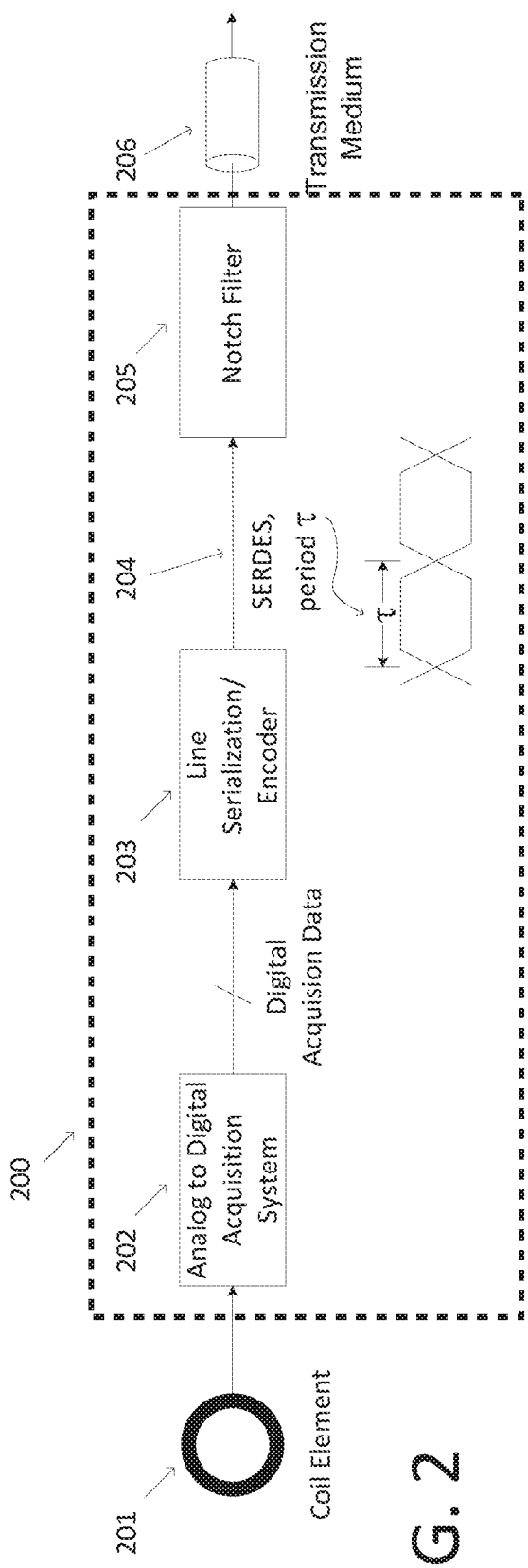
FIG. 2 is a diagram of the data path circuitry in the MRI apparatus.

Embodiments will be described with reference to the drawings.

FIG. 1 is a diagram illustrating the configuration of an MRI apparatus according to a first embodiment. As illustrated in FIG. 1, an MRI apparatus 100 according to the first embodiment is provided, for example, with static field magnets 101, gradient coils 103, a gradient magnetic field power supply 105, a table 107, a table control circuitry 109, a transmission circuitry 113, a transmission coil 115, a reception coil 117, a reception circuitry 119, an imaging control circuitry 121, an interface 123, a display 125, a storage device 127, and processing circuitry 129.

A static field magnet 101 is formed into an approximately cylindrical, hollowed shape. The static field magnet 101 generates a static magnetic field uniformly in its inner space. A superconducting magnet may be adopted as the static field magnet 101. The static field magnet 101 may be formed into an open-end type.

A gradient coil 103 is formed into an approximately cylindrical, hollowed shape. Each gradient coil 103 is arranged inside the static field magnet 101. The gradient coil 103 is constituted by combining three coils corresponding to the X, Y, and Z axes that are orthogonal to each other. The Z-axis direction is the same as the direction of the static magnetic field. The Y-axis direction is the vertical direction, and the X-axis direction is a direction perpendicular to the Z and Y axes. The three coils of the gradient coil 103 individually receive the power supplied from the gradient magnetic field power supply 105, and each of the coils generates a gradient magnetic field, the magnetic intensity of which varies along the X, Y, or Z axis. In consideration of the three coils being controlled through different channels, the gradient coil 103 may be referred to as a "gradient coil having a plurality of channels".

The gradient magnetic fields generated in the X, Y, and Z axes by the gradient coil 103 may form a frequency encoding gradient magnetic field (also referred to as a read-out gradient magnetic field), a phase encoding gradient magnetic field, and a slice selection gradient magnetic field. The frequency encoding gradient magnetic field is used for changing the frequency of a magnetic resonance (MR) signal in accordance with the spatial position. The phase encoding gradient magnetic field is used for changing the phase of the MR signal in accordance with the spatial position. The slice selection gradient magnetic field is used for determining an imaging cross unit.

Under the control of the imaging control circuitry 121, the gradient magnetic field power supply 105 serves as a power supply device that supplies a current to the gradient coil 103. The gradient magnetic field power supply 105 will be explained in detail later.

The table 107 is a device that includes a table top 107a on which a subject P lies. Under the control of the table control circuitry 109, the table 107 moves the table top 107a carrying the subject P thereon, into a bore 111. The table 107 may be installed in an examination room in which the MRI apparatus 100 is installed in a manner that the longitudinal direction of the table 107 is positioned parallel to the center axis of the static field magnet 101.

The table control circuitry 109 controls the table 107, and drives the table 107 in accordance with the instructions input by the operator on the interface 123, thereby moving the table top 107a in the longitudinal and vertical directions. The table control circuitry 109 is an example of a means for realizing a table controller.

Under the control of the imaging control circuitry 121, the transmission circuitry 113 supplies a radio frequency (RF) pulse corresponding to a Larmor frequency to the transmission coil 115. The Larmor frequency in MRI is the rate of precession of the magnetic moment of the proton around the external magnetic field and is, for example, 64 MHz. 128 MHz is also possible. The transmission circuitry 113 is an example of a means for realizing a transmitter.

The transmission coil 115 is an RF coil arranged inside the gradient coil 103. Upon supply of the RF pulse from the transmission circuitry 113, the transmission coil 115 generates a transmission RF wave corresponding to a high-frequency magnetic field. The transmission coil may be a whole body coil (WB coil). The WB coil may be used as a transmission/reception coil.

The reception coil 117 is an RF coil arranged inside the gradient coil 103. The reception coil 117 receives an MR signal released from the subject P in the high-frequency magnetic field. The reception coil 117 outputs the received MR signal to the reception circuitry 119. The reception coil 117 may be a coil array including one or more coil elements, or typically including a plurality of coil elements. In FIG. 1, the transmission coil 115 and the reception coil 117 are illustrated as separate RF coils. However, the transmission coil 115 and the reception coil 117 may be realized as an integrated transmission/reception coil. The transmission/reception coil may be provided to correspond to the imaging target area of the subject P. For example, a head coil may be arranged as a local reception/transmission RF coil.

Under the control of the imaging control circuitry 121, the reception circuitry 119 generates a digital MR signal that is the digitized complex data, based on the MR signal output from the reception coil 117. In particular, the reception circuitry 119 implements various signal processes onto the MR signal output from the reception coil 117, and thereafter executes an analog-to-digital (A/D) conversion onto the data subjected to the signal processes. The reception circuitry 119 samples the A/D converted data. In this manner, a digital MR signal (hereinafter referred to as "MR data") is generated. The reception circuitry 119 outputs the generated MR data to the imaging control circuitry 121. The reception circuitry 119 is an example of a means for realizing the receiver.

The imaging control circuitry 121 controls the gradient magnetic field power supply 105, the transmission circuitry 113, and the reception circuitry 119 in accordance with an imaging protocol output from the processing circuitry 129, and performs imaging of the subject P. The imaging protocol includes various pulse sequences corresponding to an examination. The imaging protocol may define, for example, a gradient magnitude field waveform indicating the magnitude of the current supplied from the gradient magnetic field power supply 105 to the gradient coil 103, the timing of supplying the current from the gradient magnetic field power supply 105 to the gradient coil 103, the size of the RF pulse supplied by the transmission circuitry 113 to the transmission coil 115, the timing of supplying the RF pulse from the transmission circuitry 113 to the transmission coil 115, and the timing of receiving the MR signal by the reception coil 117. The imaging control circuitry 121 is an example of a means for realizing an imaging controller.

The interface 123 includes a circuit that receives various commands and information from the operator. The interface 123 may include a circuit that relates to an input device, for example, a pointing device such as a mouse, or an input device such as a keyboard. The circuit included in the interface 123 is not limited to circuits related to physical components for operation, such as a mouse and keyboard. The interface 123 may be, for example, provided with an electric signal processing circuit for receiving electric signals corresponding to an operation that is input from an input device externally arranged separate from the MRI apparatus 100, and outputting the received electric signals to various other circuits.

Under the control of the system control function 129a of the processing circuitry 129, the display 125 displays MR images generated by an image generation function as well as various information relating to the imaging and image processing. The display 125 may be a device such as a CRT display, liquid crystal display, organic EL display, LED display, plasma display, or any other display or monitor known in the field of the technology.

The storage device 127 stores therein the MR data to fill the k-space by using the image generation function 129b, and image data generated by the image generation function 129b. The storage device 127 also stores therein imaging protocols and imaging conditions such as various imaging parameters that define the imaging protocols. The storage device 127 stores programs corresponding to various functions implemented by the processing circuitry 129. The storage device 127 may be, for example, a Random Access Memory (RAM), a semiconductor memory element such as a flash memory, a hard disk drive, a solid state drive, and an optical disk. The storage device 127 may be a drive device that reads and writes various information from and into a portable storage medium such as a CD-ROM drive, DVD drive, and flash memory. The storage device 127 is an example of a means for realizing a storage unit.

The processing circuitry 129 includes, as hardware resources, a not-shown processor and memories such as a Read-Only Memory (ROM) and RAM, and controls the MRI apparatus 100. The processing circuitry 129 is provided with the system control function 129a and the image generation function 129b. The various functions, which are performed by the system control function 129a and the image generation function 129b, are stored in the storage device 127 in the form of a computer-executable program. The processing circuitry 129 is a processor that reads from the storage device 127 a program corresponding to each function, and executes the program so that the function corresponding to this program can be realized. In other words, the processing circuitry 129 that has read the programs may be provided with the functions of the processing circuitry 129 indicated in FIG. 1. The processing circuitry 129 is an example of a means for realizing a processor.

The structure of FIG. 1 has been explained as a single processing circuitry 129 realizing the functions. However, a plurality of independent processors may be combined to form a processing circuitry 129 so that the functions can be realized by each processor implementing the respective programs. That is, the aforementioned functions may be prepared as programs so that the programs can be implemented by one processing circuitry, or a specific function can be implemented by a dedicated and independent program implementing circuit.

The above "processor" may denote any circuit such as a CPU (Central Processing Unit), a GPU (Graphics Processing Unit), an Application Specific Integrated Circuit (ASIC), or a Programmable Logic Device (e.g., a Simple Programmable Logic Device (SPLD), a Complex Programmable Logic Device (CPLD), and a Field Programmable Gate Array (FPGA)).

The processor realizes the functions by reading and implementing the programs stored in the storage device 127. Instead of storing the programs in the storage device 127, the programs may be directly incorporated into the circuit of the processor. If this is the case, the processor realizes the functions by reading and implementing the programs incorporated in the processor. Similarly, the table control circuitry 109, the transmission circuitry 113, the reception circuitry 119, and the imaging control circuitry 121 are also constituted by the above processor, or by an electronic circuit.

The processing circuitry 129 controls the MRI apparatus 100 with the system control function 129a. Specifically, the processing circuitry 129 reads a system control program stored in the storage device 127, expands it on the memory, and controls the circuits of the MRI apparatus 100 in accordance with the expanded system control program. The processing circuitry 129 may read an imaging protocol from the storage device 127 using the system control function 129a, based on the imaging conditions that the operator inputs on the interface 123. The processing circuitry 129 may generate an imaging protocol based on the imaging conditions. The processing circuitry 129 transmits the imaging protocol to the imaging control circuitry 121, and controls the imaging of the subject P. The processing circuitry 129 that implements the system control function 129a is an example of a means for realizing a system controller.

With the image generation function 129b, the processing circuitry 129 loads the MR data along the k-space read-out direction, in accordance with the intensity of the read-out gradient magnetic field. The processing circuitry 129 performs a Fourier transform on the MR data loaded in the k-space, so as to generate an MR image. The processing circuitry 129 outputs the MR image to the display 125 and the storage device 127. The processing circuitry 129 that implements the image generation function 129b is an example of a means for realizing an image generator.

The overall structure of the MRI apparatus 100 according to the first embodiment has been described. Next, the structure of the reception circuitry 119 and the RF coil will be explained with reference to FIG. 2. Coil element 201 produces an analog data signal during MRI operation. The analog signal is fed to analog/digital signal processor 200 where it is converted to a digital acquisition data by analog-to-digital subsystem 202. The digital acquisition data is encoded by a line serialization/encoder 203. Encoder 203 produces encoded data which may be in the form of a SERDES (Serializer/Deserializer) data stream 204 with a period T. The SERDES stream is input to a notch filter 205 centered at a frequency corresponding to $\tau$. The SERDES stream after notch filter is transmitted over transmission medium 206. Medium 206 may be an intra-coil medium or a coil-system medium.

Figure 3:
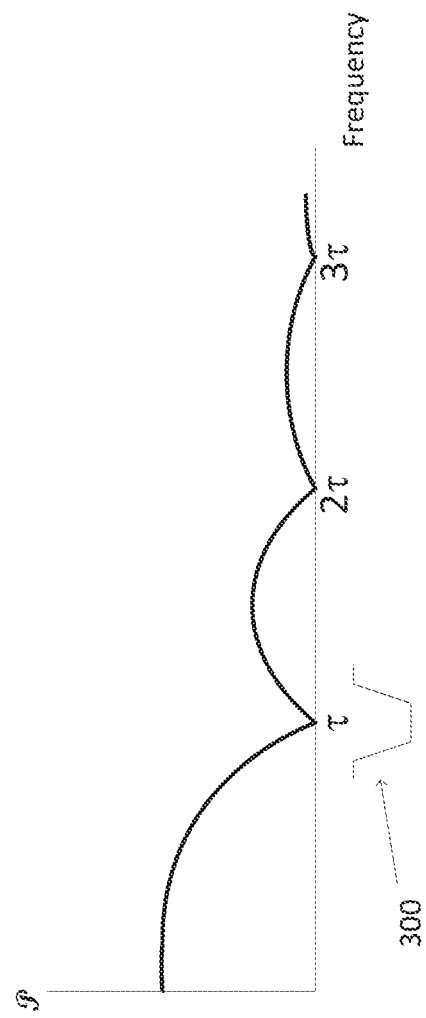
FIG. 3 is a graph illustrating the power spectral density of the data stream.

As shown in FIG. 2, the SERDES stream is encoded to have a period $\tau$. If $\tau$ is chosen to match the Larmor frequency, the spectral content will be minimized at the Larmor frequency. FIG. 3 shows the power spectrum density of the SERDES stream as a function of frequency. The density has a null at multiples of $\tau$. Since the data content of the SERDES stream is essentially zero at frequencies equal to multiples of $\tau$, interference at frequencies of multiples of $\tau$ does not have any significant effect on the data stream. Choosing $\tau$ to be equal to the Larmor frequency minimizes noise artifacts generated at the Larmor frequency from the RF coils on subsequent data transmission lines such as a coaxial cable.

The notch filter is indicated schematically as 300. The notch filter has a desired attenuation with a desired bandwidth centered at the frequency $\tau$. For example, the attenuation may be $\leq -3$ dB over a bandwidth equal to the imaging band (e.g. 1 MHz).

Figure 4:
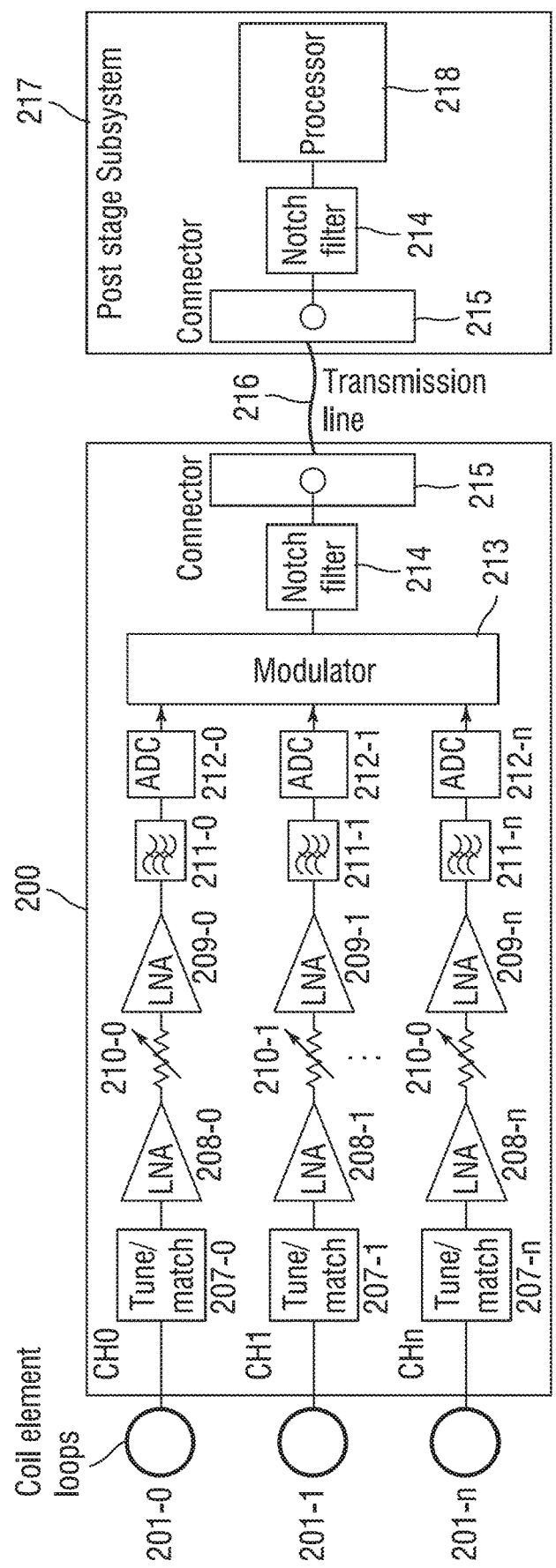
FIG. 4 is a diagram of the MRI data acquisition and post processing subsystems.
Figure 5:
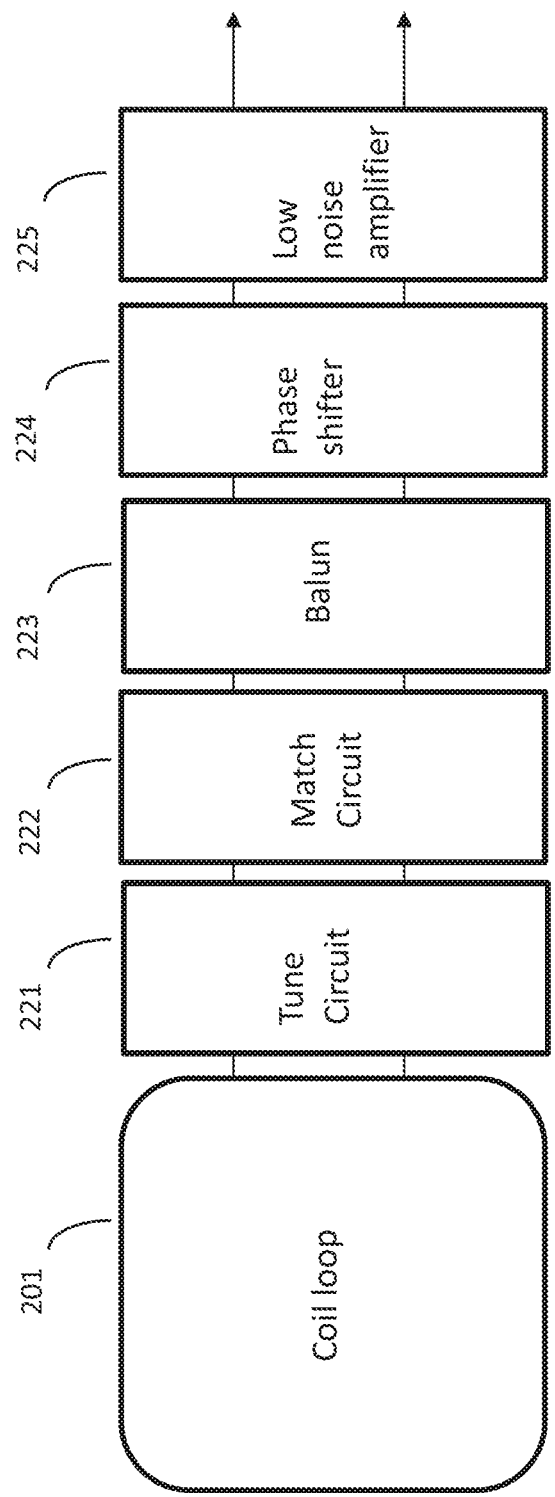
FIG. 5 is a diagram of the tune/match circuit of FIG. 4.

FIG. 4 shows the system 200 in more detail. RF coil element 201 has coil element loops 201-0 to 201-n where n can range from 1-128, for example, and is typically in a range of about 8-32. The coil element loops 201-0 to 201-n are associated with data channels CH0-CHn, respectively of the subsystem 202. Each channel of the subsystem 202 has a series of circuits for transferring the analog data signals from the RF coils and converting the analog signals from the RF coils to digital signals. Channel CH0, as an example, includes tuning/matching circuit 207-0, an example of which is shown in FIG. 5.

Circuit 207-0 has tune and match sections 221 and 222, respectively in a balanced configuration shown connected to a coil loop 201, followed by a discrete balun 223 to convert the balanced configuration to a single-ended transmission line. The phase shifter 224 transforms the preamp input impedance to a high impedance as seen by the coil. A coaxial cable, microstrip or stripline may be substituted for the phase shifter 224 to provide the appropriate impedance. The output of the phase shifter 224 (or one end of the cable, microstrip or stripline) is connected to a low noise amplifier 225.

In more detail, tune circuit 221 is preferably a series-connected pair of capacitors arranged across the differential line grounded at the node between the capacitors. Match circuit 223 is preferably a pair of inductors respectively arranged in each of the differential lines. Balun circuit 223 is a pair of L-C circuits respectively arranged for each of the differential lines. Phase shift circuit 224 is an L-C circuit to provide the desired impedance.

Channel CH0 also has an amplifier circuit having the structure of two low noise amplifiers (LNAs) 208-0 and 209-0 separated by an attenuator 210-0 made up of, for example, a variable resistor for gain adjustment. The two LNAs are typically different, with the LNA closer to the coil having a lower noise figure and having an input impedance suitable for a coil interface. The amplified data signal is fed to bandpass filter 211-0 designed for the imaging band. As an example, the bandpass filter will have a flat response in the imaging band. The signal output by the bandpass filter 211-0 is converted into a digital data signal by ADC 212-0. Typically this data signal contains 16 bits.

The digital data signals from ADCs 212-0 to 212-n undergo digital encoding in modulator 213. Modulator 213 may be, for example, a line serialization/encoding unit. Modulator 213 encodes the digital data signals from ADCs 212-0 and 212-n using standard DC-balanced, limited run length techniques such as, for example 8B/10B encoding and produces a SERDES data stream of two symbols each being 10 bits from the 16-bit data. The run length can be limited to 5 symbols, for example. The 8B/10B decoding function can be provided using a discrete chipset such as, for example, the Cypress CY7B923/CY7B933 HOTLink transmitter/receiver, or as part of a multi-function chipset.

The data stream output by the modulator 213 is fed to a notch filter 214. Notch filter 214 is a band eliminating filter centered at the null frequencies, preferably the Larmor frequency (64 MHz), to further reduce frequency components in the SERDES stream. Since filter 214 is matched to the null frequency, the SERDES stream can be transferred to downstream components without losing the fidelity of the data signal.

Figure 6:
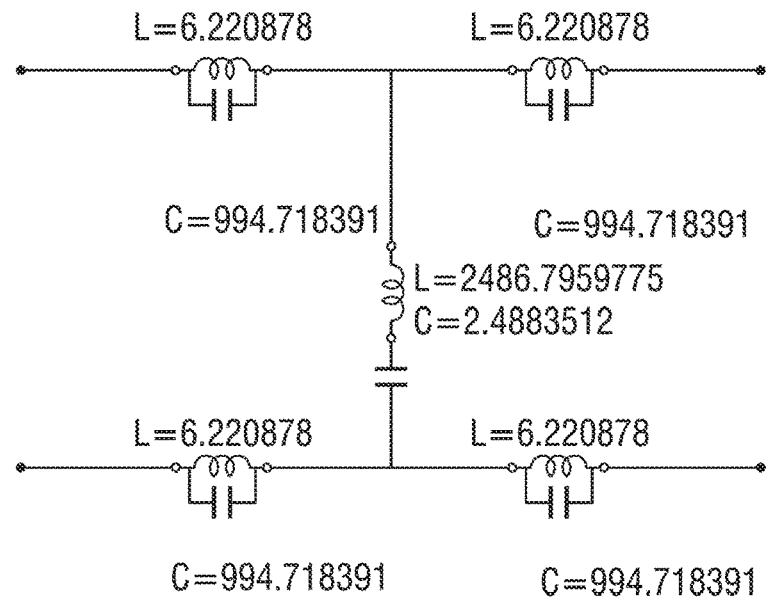
FIG. 6 is a circuit diagram of a notch filter according to the invention.

An example of filter 214 is shown in FIG. 6. Filter 214 has a differential line construction which blocks common mode current on the transmission line, eliminating the need for a balun on the transmission line. The parallel L-C circuits have typical values of 6.22 nH and 994.72 pF. A series-connected L-C circuit with a 2486.8 nH inductor and 2.49 pF capacitor is located between the pairs of parallel L-C circuits. These typical values are one example and other values which provide the desired notch frequency response are possible. This filter may be used with an LVDS (low-voltage differential signal) data transmission line.

Figure 7:
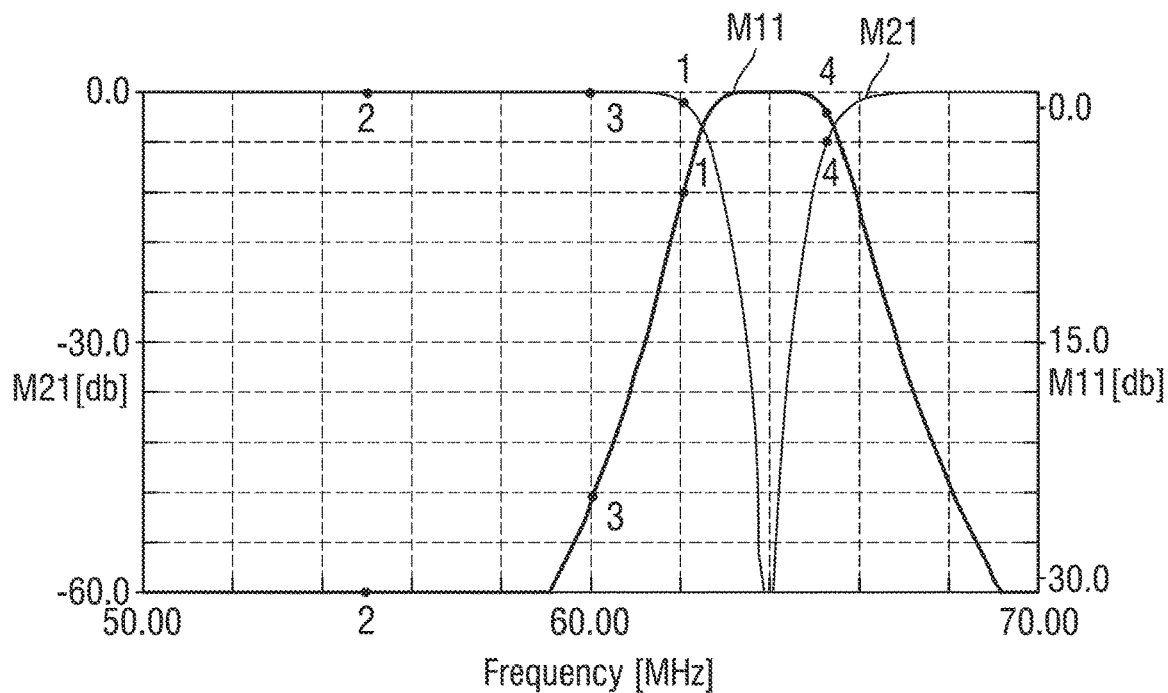
FIG. 7 is a graph illustrating the frequency response of the notch filter of FIG. 6.

The frequency response of filter 210 is shown in FIG. 7. Filter 210 produces a −60 dB attenuation at approximately the Larmor frequency. Other attenuation values may be chosen that provide sufficient suppression of the frequency components at the Larmor frequency. Filter 211 preferably is centered at approximately the Larmor frequency and has a −3 dB bandwidth of about 1 MHz.

FIG. 7 shows the return loss M11 and the insertion loss M21. The return loss is how much energy is reflected back to the source by the filter. The insertion loss shows the energy that goes through the filter. The filter of FIG. 7 is preferably a band-reject (notch) filter at the imaging frequency (~64 MHz, or a 1.5T system). The filter of FIG. 7 removes frequencies in the SERDES stream that could interfere with the imaging signal from the patient/subject (~64 Mhz at 1.5T).

Figure 8:
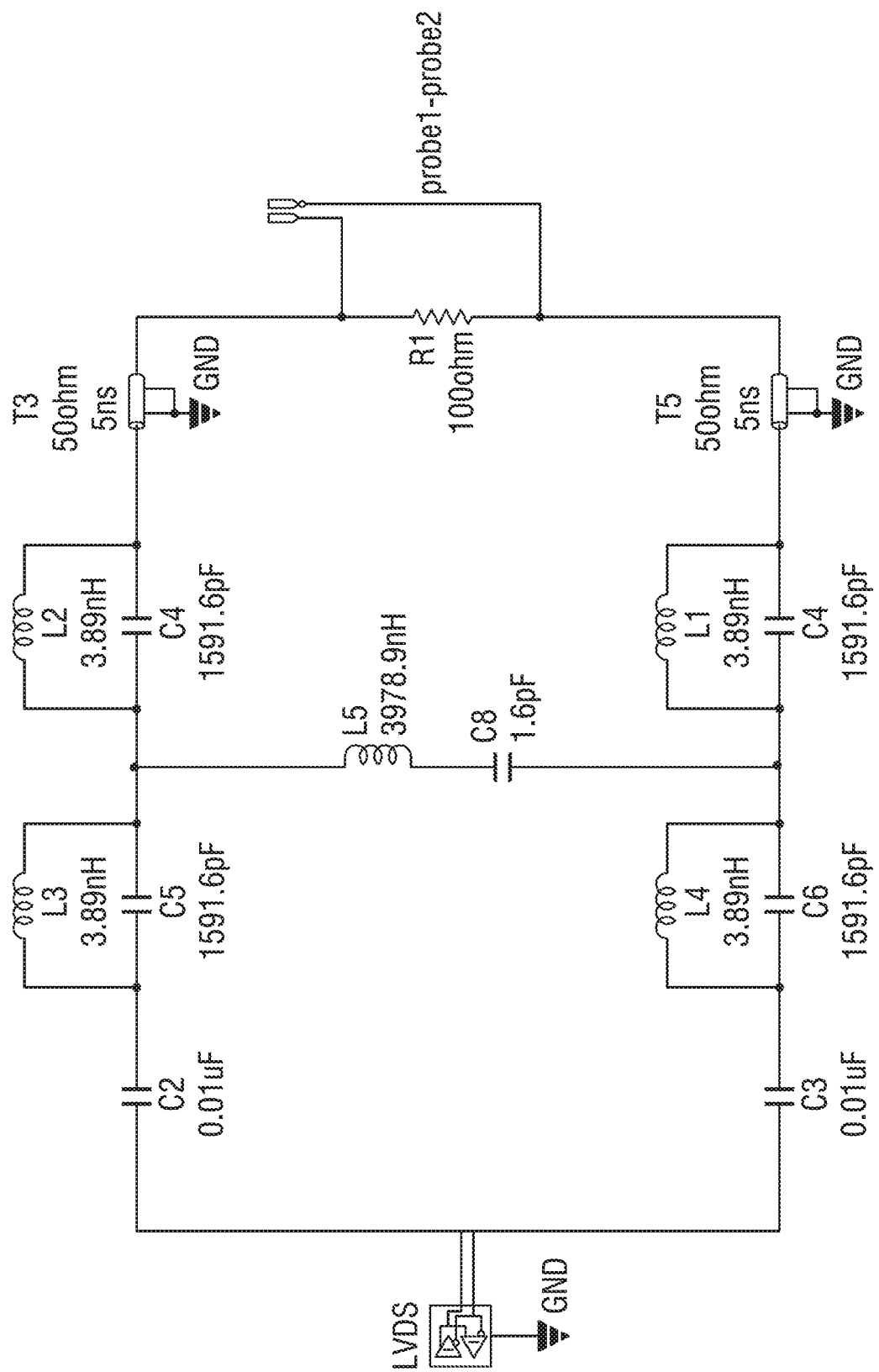
FIG. 8 is a circuit diagram of a notch filter according to the invention.

Another example of the notch filter is shown in FIG. 8. This filter is designed for use with an LVDS data line.

Figure 9B:
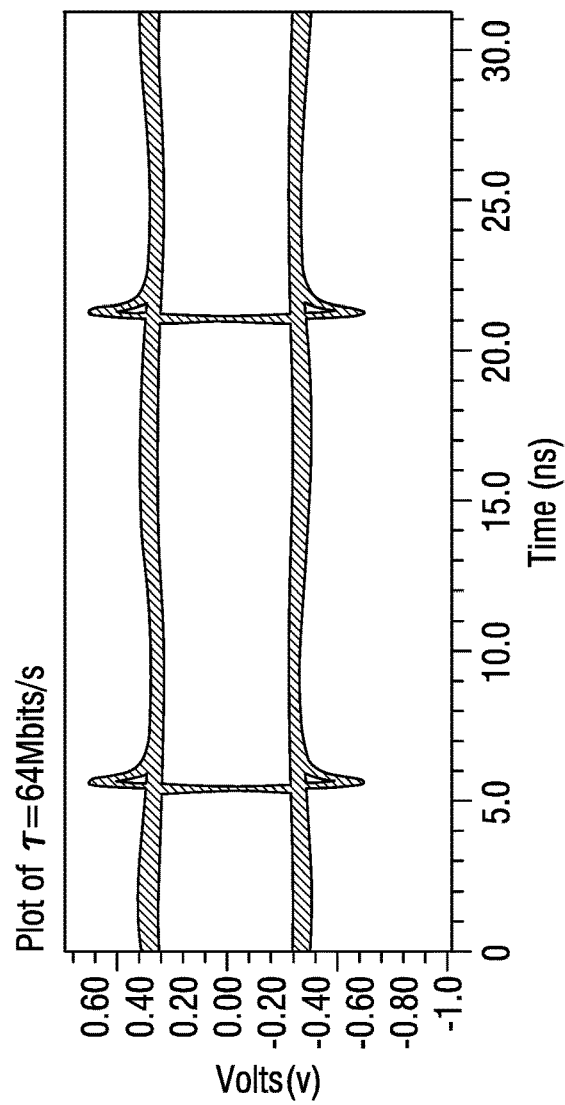
FIGS. 9A and 9B are a signal diagram and a corresponding eye diagram, respectively, of the MRI apparatus according to the invention.
Figure 9A:
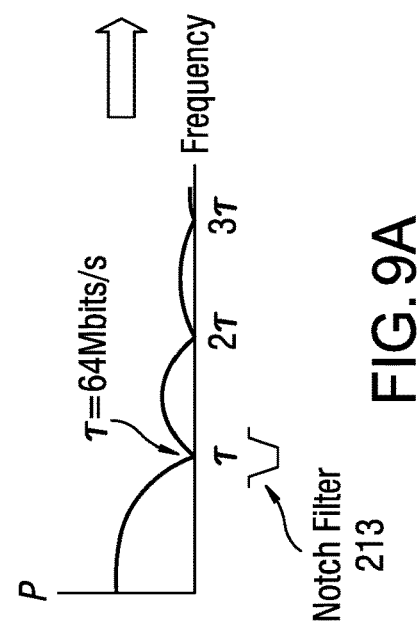
Figure 10B:
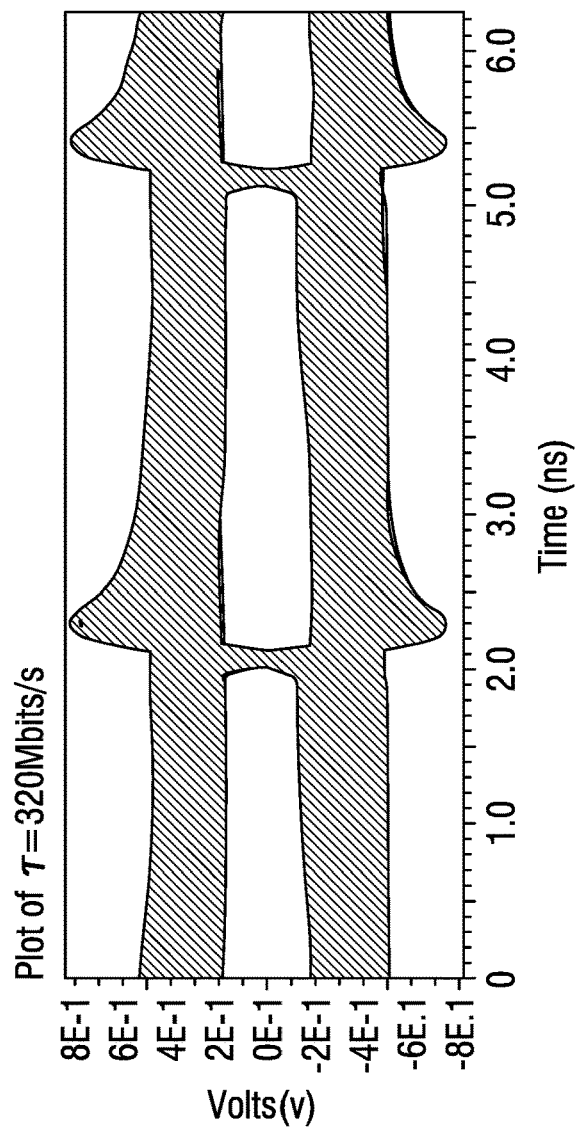
FIGS. 10A and 10B are a signal diagram and a corresponding eye diagram, respectively, of a comparative example.
Figure 10A:
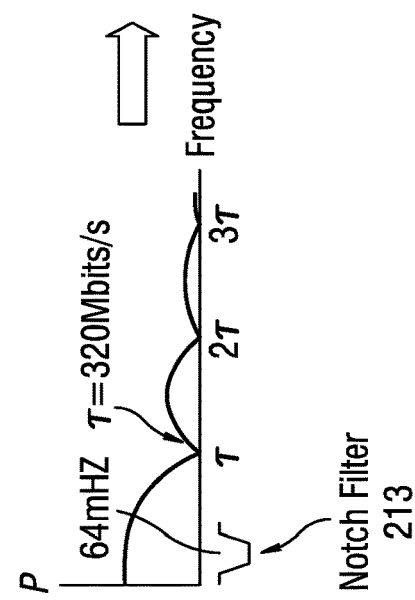

An eye pattern diagram is useful to show the fidelity of signal transmission. FIGS. 9A and 9B show a signal diagram and a corresponding an eye diagram corresponding to the invention where the encoding is selected such that τ=64 MHz and including a notch filter also centered at 64 MHz (schematically indicated). A comparative example is shown in FIGS. 10A and 10B with a notch filter centered at approximately 64 Mhz and τ=320 MHz. The diagram in FIG. 9B has a wider, more open eye pattern and narrower voltage excursions, demonstrating the reduced distortion and fewer timing errors possible with the invention. In particular, FIGS. 9B and 10B show how having the notch filter centered at the Larmor frequency removes potential electromagnetic interference at the imaging frequency, while maintaining the integrity of the SERDES stream. As shown in FIGS. 10A and 10B, the notch filter at the Larmor frequency removes spectral content from the SERDES stream, making the eye smaller (the smaller the eye, the lower the signal integrity).

Returning to FIG. 4, the data signal after passing through notch filter 213 is typically fed to a connector 214 for transfer over data transmission line 215. In the example of FIG. 2, data transmission line 215 is also connected via a connector 214 of post stage subsystem 216 for analysis of the data using data processing circuit 217.

Data transmission line 215 is an electronic data cable. In one example, transmission line 215 is a coaxial cable since the interference at the Larmor frequency is eliminated or substantially reduced. A coaxial cable can be used when subsystem 216 is remote from circuit 200 or when connecting different subsystems. If the distance is long, baluns or additional notch filters may be placed on the cable [please explain the positioning of the baluns and additional notch filter]. The additional notch filters may have the same structure as notch filter 213 or can have a different structure with the notch centered at approximately 64 MHz.

The transmission line can also be an LVDS communication line. The LVDS line accepts the encoded data, preferably 8B/10B encoded data and is effective in eliminating common mode noise. Filter 214 can be advantageously used with the LVDS line.

Figure 11:
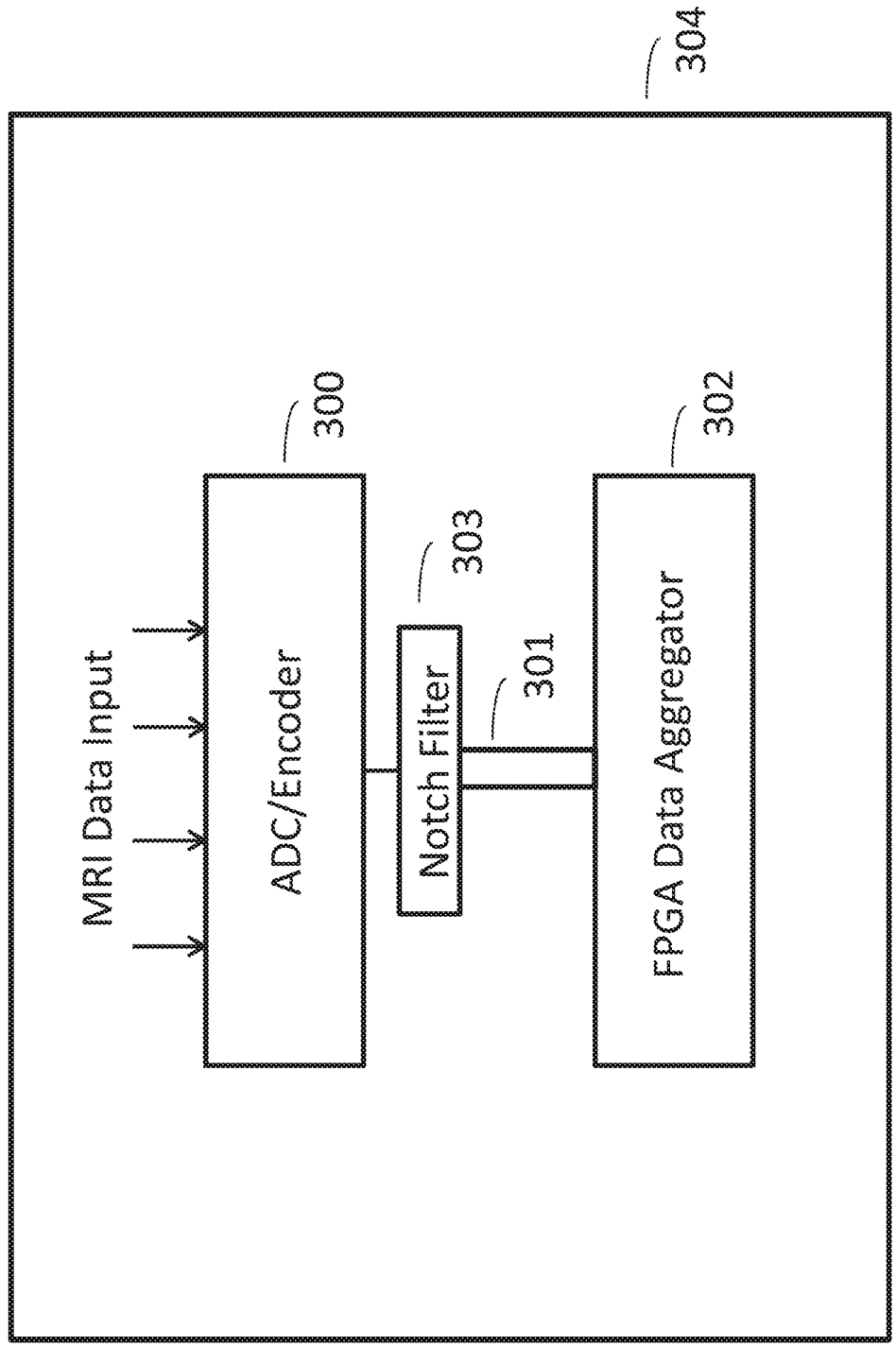
FIG. 11 is a block diagram of an embodiment disposed on a PCB board with a strip line or microstrip transmission line.

Another example of the transmission line is shown schematically in FIG. 11 as a strip line or microstrip. In some MRI machines, an FPGA data aggregating chip 302 is connected to an ADC chip 300 acting as a modulator/encoder over strip line or microstrip transmission line 301 on PC board 304. Notch filter 303 centered at approximately the Larmor frequency may be used to further reduce noise components.

Figure 12:
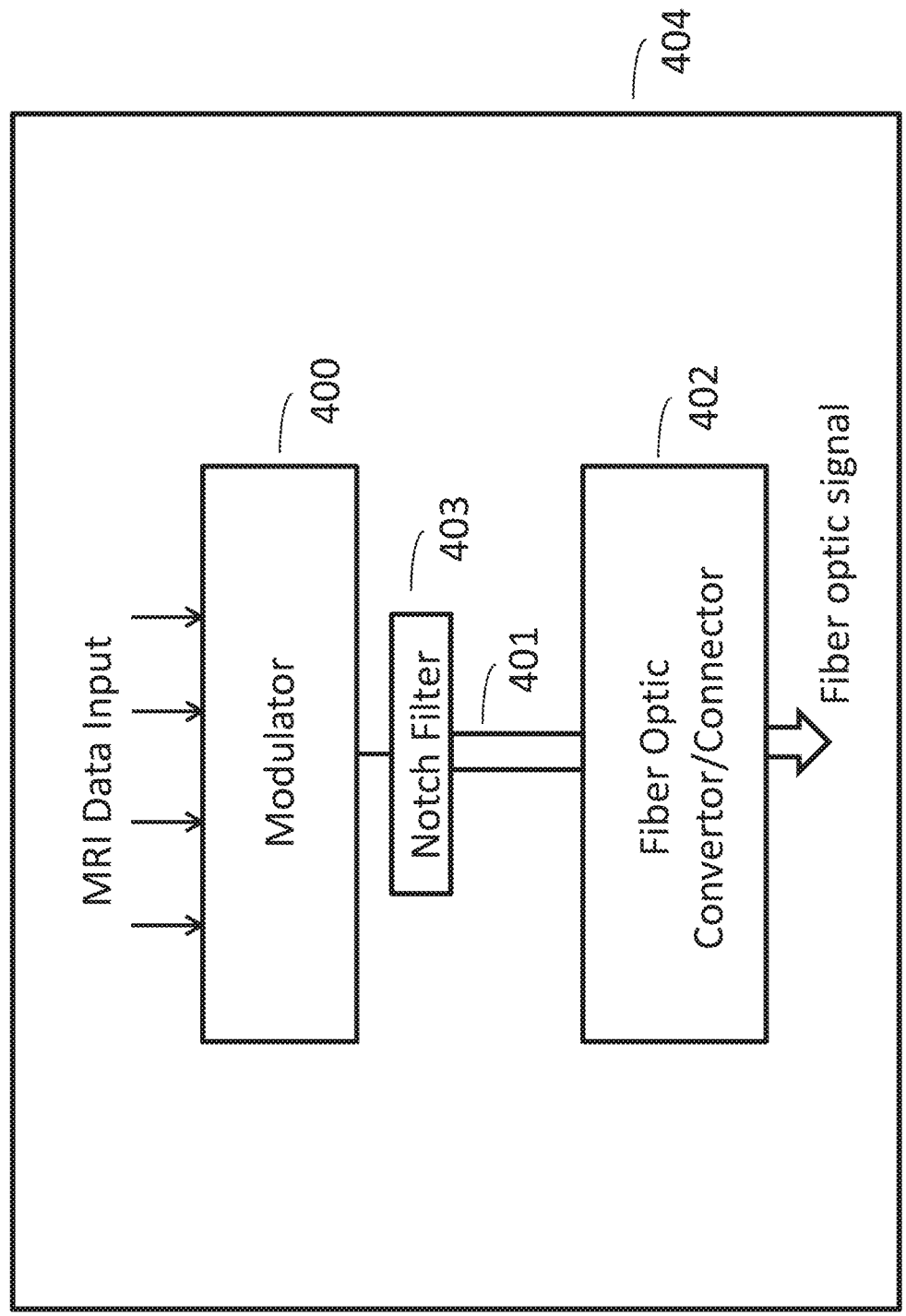
FIG. 12 is a block diagram of an embodiment disposed on a PCB board with a strip line or microstrip transmission line and fiber optic convertor.

A third example is shown in FIG. 12. The transmission line 401 connects the modulator 400 and a fiber optic convertor/connector 402 for converting the data signal to a fiber optic signal for transmission as an optical signal. Notch filter 403 may also be used. Transmission line 401 is also a strip line or microstrip on PC board 404.

The apparatus according to the present invention has several advantages. First, and foremost, electrical data signal transmission can be achieved between circuits or subsystems in the MRI apparatus. Second, the cost of an MRI apparatus utilizing the invention is lowered due to the reduced amount of shielding needed since the influence of the MR operating frequency can be greatly reduced.

Another advantage is reduced cost and weight of the RF coils and the interface cable of the RF coil and improved workability due to the decreased weight. The coil and/or interface cable conventionally has large and heavy baluns which can be eliminated or reduced in number when using the apparatus according to the invention.

A still further advantage is reduced heat from eliminating the use of the fiber optic connection conventionally used with electronic data transfer in MRI machines. This is particularly helpful when the fiber optic connector is located close to the patient and the heat generated by fiber optic connection complicates operation by limiting the temperature operating margin or nearing the patient safety limit.

Figure 13:
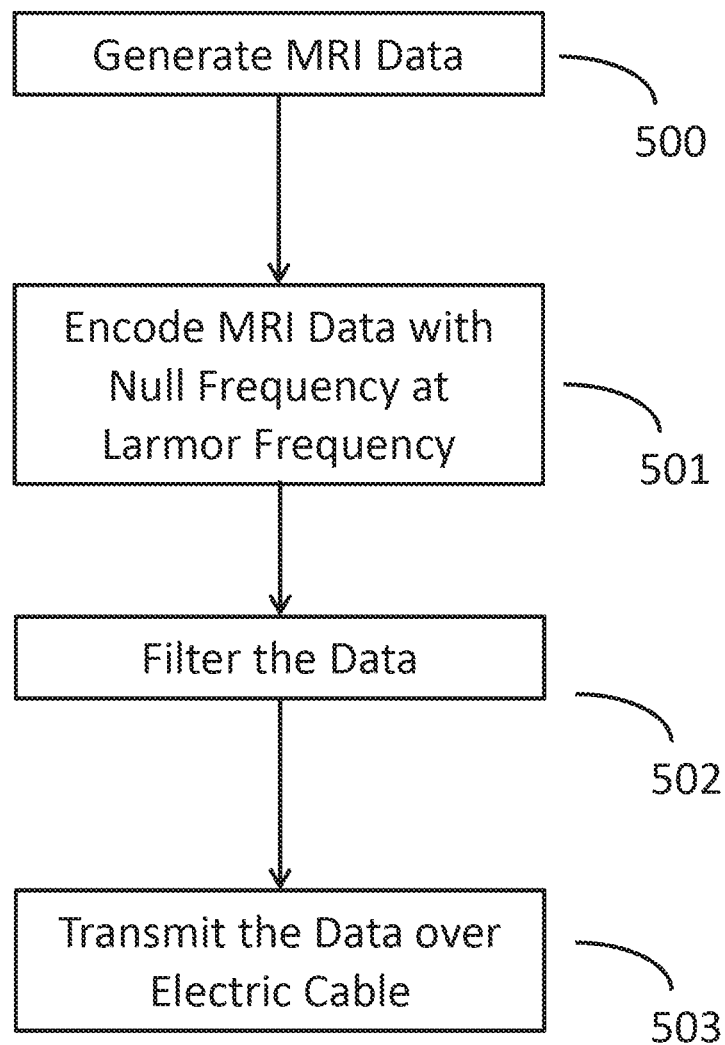
FIG. 13 is a flow diagram of a method of operating an MRI apparatus according to the invention.

An embodiment of the method of operating an MRI apparatus is illustrated in FIG. 13. An MRI data signal is generated in the MRI apparatus at step 500. In one example, the data signal is produced from the RF coils. The MRI apparatus operates at the Larmor frequency, 64 Mhz. The data signal is digitally encoded at step 501 using, for example, standard DC-balanced, limited run length techniques such as, for example 8B/10B encoding to produce a data stream such as a SERDES data stream. The null frequency of the encoding is set approximately to the Larmor frequency, 64 MHz.

At step 502, the encoded data is subjected to filtering with a notch filter approximately centered at the Larmor frequency to remove further frequency components around the Larmor frequency. The filtered data is transmitted over an electric transmission line in step 503. The transmission line may be a coaxial cable, strip line or microstrip conductor.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A magnetic resonance imaging apparatus, comprising:
    data acquisition circuitry configured to generate magnetic resonance data;
    a digital encoder connected to receive the magnetic resonance data and configured to digitally encode the magnetic resonance data using an encoding scheme having a spectral null approximately at the Larmor frequency; and
    an electric digital data transmission line connected to transmit the digitally encoded magnetic resonance data.

2. The magnetic resonance imaging apparatus according to claim 1, wherein the data acquisition circuitry comprises:
    RF receiving coils; and
    analog to digital conversion circuitry.

3. The magnetic resonance imaging apparatus according to claim 1, wherein the electric digital data transmission line comprises one of a coaxial cable, a strip line and an LVDS (low-voltage differential signal) line.

4. The magnetic resonance imaging apparatus according to claim 3, comprising:
a notch filter having a notch frequency approximately centered at the Larmor frequency connected to receive the digitally encoded magnetic resonance data.

5. The magnetic resonance imaging apparatus according to claim 3, wherein no balun is provided on the electric digital data transmission line.

6. The magnetic resonance imaging apparatus according to claim 1, wherein no balun is provided on the electric digital data transmission line.

7. The magnetic resonance imaging apparatus according to claim 1, comprising:
a notch filter having a notch frequency approximately centered at the Larmor frequency connected to receive the digitally encoded magnetic resonance data.

8. The magnetic resonance imaging apparatus according to claim 7, comprising the notch filter connected between the digital encoder and the electric digital data transmission line.

9. The magnetic resonance imaging apparatus according to claim 1, wherein the encoder is configured to digitally encode the magnetic resonance data using an 8B/10B encoding scheme.

10. The magnetic resonance imaging apparatus according to claim 1, comprising a data acquisition sub-system connected to the electric data transmission line.

11. The magnetic resonance imaging apparatus according to claim 10, wherein the sub-system comprises a notch filter receiving the digitally encoded data transmitted over the electric digital data transmission line.

12. The magnetic resonance imaging apparatus according to claim 1, comprising a data aggregating circuit, wherein the electric digital data transmission line comprises a strip line connected between the encoder and the data aggregating circuit.

13. The magnetic resonance imaging apparatus according to claim 1, comprising a fiber optical conversion circuit, wherein the electric digital data transmission line comprises a strip line connected between the encoder and the fiber optic conversion circuit.

14. The magnetic resonance imaging apparatus according to claim 1, wherein:
the digital encoder is connected to receive the magnetic resonance data at the Larmor frequency and configured to digitally encode the magnetic resonance data using the encoding scheme having the spectral null approximately at the Larmor frequency.

15. A method of operating a magnetic resonance imaging (MRI) apparatus, comprising:
acquiring MRI data using the apparatus;
digitally encoding the data such that a frequency component at approximately the Larmor frequency is approximately zero; and
transmitting digitally encoded data over transmission line.

16. The method according to claim 15, comprising transmitting the encoded data over an electric digital data having no balun.

17. The method according to claim 15, comprising transmitting the encoded data over one of a coaxial able, strip line, and LVDS.

18. The method according to claim 15, comprising filtering the digitally encoded data to remove frequency components at approximately the Larmor frequency.

19. The method according to claim 15, comprising filtering the digitally encoded data using a notch filter centered at approximately the Larmor frequency.

20. The method according to claim 15, comprising encoding the digitally encoded data using an 8B/10B encoding scheme.

21. The method according to claim 20, comprising filtering the digitally encoded data to remove frequency components at approximately the Larmor frequency.

22. The method according to claim 15, comprising:
acquiring the MRI data at the Larmor frequency; and
digitally encoding the MRI data at the Larmor frequency.

23. The method according to claim 16, comprising digitally encoding the MRI data using an encoding scheme having a spectral null approximately at the Larmor frequency.

* * * * *